US010297634B2

United States Patent
Yu et al.

(10) Patent No.: US 10,297,634 B2
(45) Date of Patent: May 21, 2019

(54) COMPOSITE IMAGE SENSOR AND DEVICE COMPRISING THE COMPOSITE IMAGE SENSOR

(71) Applicant: Lenovo (Beijing) Limited, Beijing (CN)

(72) Inventors: Zhou Yu, Beijing (CN); Zhi Hu Wang, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 0 days.

(21) Appl. No.: 15/462,318

(22) Filed: Mar. 17, 2017

(65) Prior Publication Data

US 2017/0271395 A1    Sep. 21, 2017

(30) Foreign Application Priority Data

Mar. 18, 2016  (CN) .......................... 2016 1 0158008

(51) Int. Cl.
*H01L 27/146*    (2006.01)
(52) U.S. Cl.
CPC .. *H01L 27/14645* (2013.01); *H01L 27/14636* (2013.01); *H01L 27/14647* (2013.01); *H01L 27/14621* (2013.01); *H01L 27/14627* (2013.01); *H01L 27/14649* (2013.01)
(58) Field of Classification Search
CPC ......... H01L 27/14645; H01L 27/14647; H01L 27/14636; H01L 27/14621; H01L 27/14649; H01L 27/14627
See application file for complete search history.

(56) References Cited

U.S. PATENT DOCUMENTS

| | | | | |
|---|---|---|---|---|
| 2013/0234029 A1* | 9/2013 | Bikumandla | ......... | H01L 25/043 250/349 |
| 2014/0138519 A1* | 5/2014 | Wang | ...................... | G01S 17/89 250/206.1 |
| 2014/0327061 A1* | 11/2014 | Lee | ................... | H01L 27/14634 257/292 |
| 2015/0054962 A1* | 2/2015 | Borthakur | .............. | H04N 5/332 348/164 |
| 2017/0237911 A1* | 8/2017 | Won | ......................... | H04N 5/33 348/164 |

FOREIGN PATENT DOCUMENTS

| | | |
|---|---|---|
| CN | 1870280 A | 11/2006 |
| JP | 2010232509 A | 10/2010 |

* cited by examiner

*Primary Examiner* — Su C Kim
(74) *Attorney, Agent, or Firm* — Ference & Associates LLC

(57) ABSTRACT

One embodiment provides a device, including: a composite image sensor, including: a wiring layer that processes electrical signals; a first photodiode layer configured to convert a first light wave signal into an electrical signal; and a second photodiode layer configured to convert a second light wave signal into an electrical signal; wherein the first photodiode layer and the second photodiode layer are separated by a predetermined distance. Other aspects are described and claimed.

20 Claims, 3 Drawing Sheets

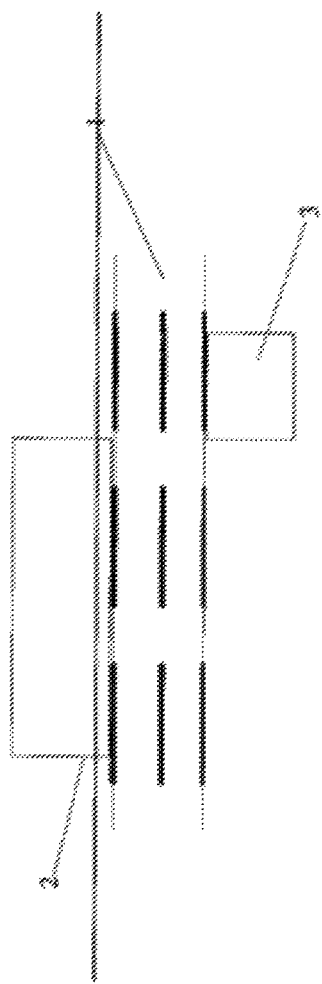
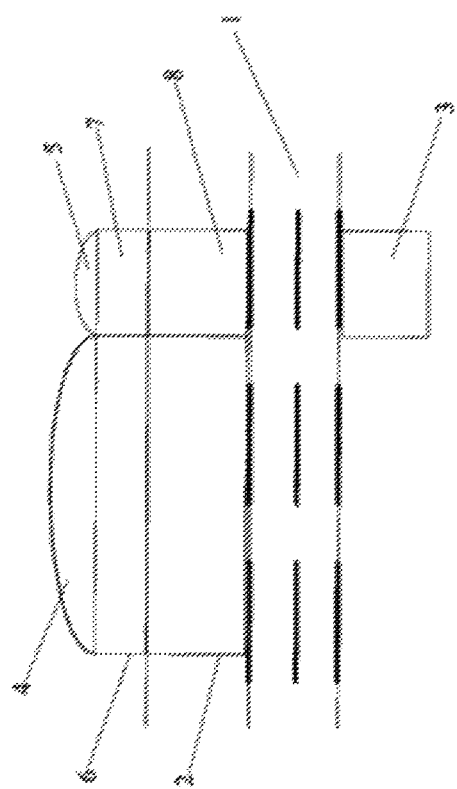

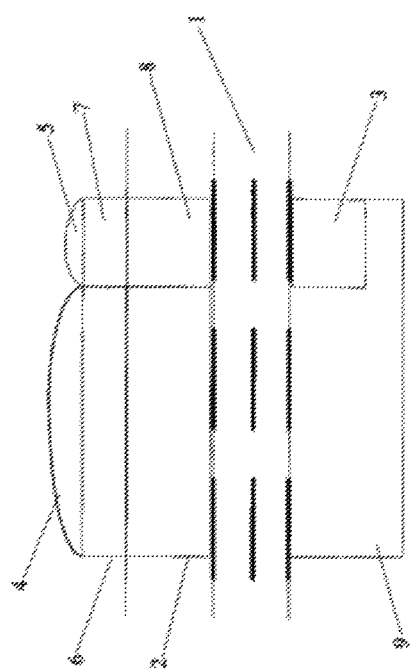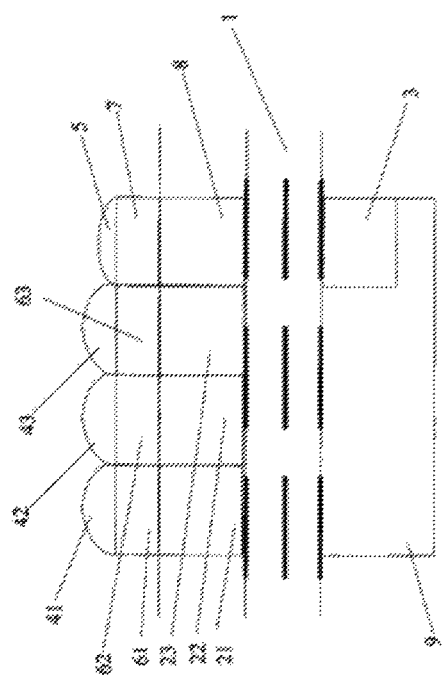

COMPOSITE IMAGE SENSOR AND DEVICE COMPRISING THE COMPOSITE IMAGE SENSOR

CLAIM FOR PRIORITY

This application claims priority to Chinese Application No. 201610158008.X, filed on Mar. 18, 2016, which is fully incorporated by reference herein.

FIELD

The subject matter described herein relates to the technical field of image sensing technologies, more specifically, it relates to a composite image sensor.

BACKGROUND

The image sensor is a device capable of converting a light signal into an electrical signal, which is widely applied in various electronic devices such as cameras, mobile phones equipped with cameras and the like. A composite image sensor refers to an image sensor integrated with a device capable of sensing a plurality of light waves and capable of identifying various light wave images thereof. For example, a composite image sensor integrated with a device is capable of sensing an infrared light and a visible light, and is capable of identifying the infrared light and the visible light of an infrared light image as well as a visible light image.

Since the composite image sensor is integrated with the multi-light wave sensing function, and has a small device size, the composite image sensor is particularly important and practical in the field of image sensors. For example, a composite image sensor integrated with the function of sensing an infrared light and a visible light is capable of implementing applications such as face recognition, fingerprint recognition, iris recognition and the like based on the capture of the infrared light signal. Additionally, the composite image sensor may be associated with applications such as environmental photographing, auxiliary recognition and the like based on capture of the visible light signal.

BRIEF SUMMARY

In summary, one aspect provides a device, comprising: a composite image sensor, including: a wiring layer that processes electrical signals; a first photodiode layer configured to convert a first light wave signal into an electrical signal; and a second photodiode layer configured to convert a second light wave signal into an electrical signal; wherein the first photodiode layer and the second photodiode layer are separated by a predetermined distance.

Another aspect provides a composite image sensor, comprising: a wiring layer that processes electrical signals; a first photodiode layer configured to convert a first light wave signal into an electrical signal; and a second photodiode layer configured to convert a second light wave signal into an electrical signal; wherein the first photodiode layer and the second photodiode layer are separated by a predetermined distance.

A further aspect provides a method, comprising: providing a first photodiode layer that converts a first light wave signal into an electrical signal; providing a second photodiode layer that converts a second light wave signal into an electrical signal; providing a wiring layer that processes electric signals from the first photodiode layer and the second photodiode layer; and wherein the first photodiode layer and the second photodiode layer are separated by a predetermined distance.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

BRIEF DESCRIPTION OF THE SEVERAL VIEWS OF THE DRAWINGS

FIG. 1 is a structural schematic diagram showing a composite image sensor according to an embodiment;

FIG. 2 is a structural schematic diagram showing a composite image sensor according to an embodiment;

FIG. 3 is a structural schematic diagram showing a composite image sensor according to an embodiment;

FIG. 4 is a structural schematic diagram showing a composite image sensor according to an embodiment;

DETAILED DESCRIPTION

Figure 5:
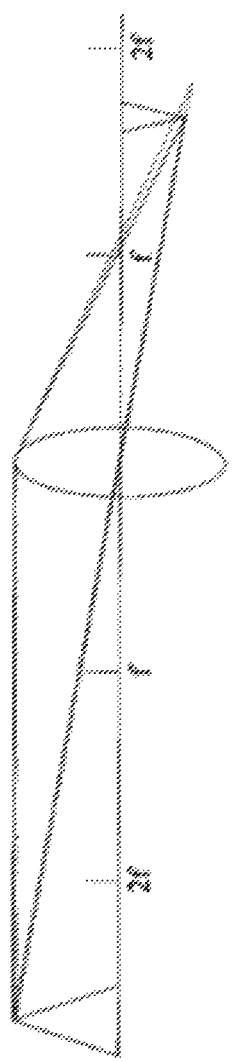
FIG. 5 is a structural schematic diagram showing an imaging plane of a visible light and an infrared light according to an embodiment.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

It has been identified that since different light waves have a greater difference in terms of wavelength, the images of various light waves formed by the conventional composite image sensor are not in the same plane, and the focal distances of the various light waves cannot be considered simultaneously, as a result, image quality is degraded. For example, because visible light is in a different wavelength range than infrared light, when the focal point of the visible light of the image sensor is perfect, the infrared light is subject to defocusing, and when the focal point of the infrared light of the image sensor is perfect, the visible light is subject to defocusing. As such, the visible light image and the infrared light image formed by the composite image sensor are not in the same plane, thus image quality is degraded.

Referring to FIG. 1, a composite image sensor according to an embodiment is illustrated. In an embodiment, the composite image sensor may comprise a wiring layer 1, a first photodiode layer 2, and a second photodiode layer 3. The wiring layer 1 may be configured to process an electrical signal, and at the same time the wiring layer 1 may also implement reading the electrical signal. The first photodiode layer 2 is stacked in a first direction of the wiring layer 1, and the first photodiode layer 2 may convert a first light wave signal into an electrical signal. The second photodiode layer 3 is stacked in a second direction of the wiring layer 1, and the second photodiode layer 3 may convert a second light wave signal into an electrical signal, wherein the first direction is opposite to the second direction.

As illustrated in FIG. 1, in an embodiment, the first photodiode layer 2 is stacked above the wiring layer 1, and the second photodiode layer 3 is stacked below the wiring layer 1. More particularly, the first photodiode layer 2 faces upward and the second photodiode layer 3 faces downward. In another embodiment, the first photodiode layer 2 is stacked below the wiring layer 1, and the second photodiode layer 3 is stacked above the wiring layer 1. More particularly, the first photodiode layer 2 faces downward and the second photodiode layer 3 faces upward.

In an embodiment, a first photodiode layer configured to convert a first light wave signal into an electrical signal is stacked in a first direction of a wiring layer, and a second photodiode layer configured to convert a second light wave signal into an electrical signal is stacked in a second direction of the wiring layer, wherein the first direction is opposite to the second direction. In an embodiment, the first photodiode layer and the second photodiode layer are not arranged on the same layer, rather they are isolated by the wiring layer, such that focal distances of the first light wave signal and the second light wave signal are both adjusted. In this way, a first light wave image and a second light wave image formed by the composite image sensor are in the same plane, thus improving the image quality.

In an embodiment, the thickness of the wiring layer may be adjusted according to an image plane deviation between the first light wave image and the second light wave image. The first light wave image is an image correspondingly formed by the first light wave signal; and the second light wave image is an image correspondingly formed by the second light wave signal. In an embodiment, the thickness of the wiring layer may correspond to the image plane deviation between the first light wave image and the second light wave image. For example, in a scenario where the first light wave signal is a visible light signal and the second light wave signal is an infrared light signal as an example, a theoretical image plane deviation between the visible light and the infrared light may be 18 micrometers. In an embodiment, the thickness of the wiring layer may be configured to correspond to the theoretical image plane deviation between the visible light and the infrared light. More particularly, the thickness of the wiring layer is equal to the theoretical image plane deviation between the visible light and the infrared light.

By configuring the thickness of the wiring layer to correspond to the image plane deviation between the first light wave image and the second light wave image, the thickness of the wiring layer may be adjusted in consideration of the focal distances of the first light wave signal and the second light wave signal. Therefore, the first light wave image and the second light wave image formed by the composite image sensor are in the same plane, thereby improving the image quality.

Referring now to FIG. 2, a composite image sensor according to an embodiment is illustrated. With reference made to FIG. 1 and FIG. 2, the composite image sensor may comprise: a first microlens layer 4, a second microlens layer 5, a light filter layer 6, and a second light wave transmission layer 7. The first microlens layer 4 may sense a first light wave signal. The second microlens layer 5 may sense a second light wave signal, wherein the first microlens layer 4 and the second microlens layer 5 are arranged on the same layer. The light filter layer 6 is stacked below the first microlens layer 4, and may filter an undesired light wave from the light wave signal sensed by the first microlens layer 4. The second light wave transmission layer 7 is stacked below the second microlens layer 5, and may transmit the light wave signal sensed by the second microlens layer 5. No light filter layers are arranged in the second light wave transmission layer 7. The second light wave transmission layer 7 and the light filter layer 6 are arranged on the same layer. In an embodiment, the first light wave signal may be a visible light signal, and the second light wave signal may be an infrared light signal.

Referring to FIG. 2, in an embodiment, the first photodiode layer 2 may be stacked below the light filter later 6. At the same time, the composite image sensor may further comprise a second light wave guiding layer 8. The second light wave guiding layer 8 may be stacked below the second light wave transmission layer 7, wherein the first photodiode layer 2 and the second light wave guiding layer 8 are arranged on the same layer.

Referring now to FIG. 3, a composite image sensor according to an embodiment is illustrated. With reference made to FIG. 2 and FIG. 3, the composite image may comprise a substrate layer 9. The substrate layer 9 may be stacked below the second photodiode layer 3 and the substrate layer 9 may be a silicon wafer substrate.

Referring now to FIG. 4, a composite image sensor according to an embodiment is illustrated. In an embodiment, the second microlens layer 5 may be an infrared light microlens layer, and the infrared light microlens layer may sense an infrared light signal. In an embodiment, the first microlens layer 4 may comprise: a red light microlens layer 41 configured to sense a red light signal; a green light microlens layer 42 configured to sense a green light signal; and a blue light microlens layer 43 configured to sense a blue light signal. The red light microlens layer 41, the green light microlens layer 42, the blue light microlens layer 43, and the infrared light microlens layer 5 are arranged, in an embodiment, on the same layer. The second light wave transmission layer 7 may be an infrared light transmission layer and the infrared light transmission layer is stacked below the infrared light microlens layer.

In an embodiment, the light filter layer 6 may comprise: a red light filter layer 61 stacked below the red light microlens layer 41; a green light filter layer 62 stacked below the green light microlens layer 42; and a blue light filter layer 63 stacked below the blue light microlens layer 43. The red light filter layer 61, the green light filter layer 62, the blue light filter layer 63, and the infrared light transmission layer 7 are arranged, in an embodiment, on the same layer.

In an embodiment, the second light wave guiding layer 8 may be an infrared light guiding layer, wherein the infrared light guiding layer is stacked below the infrared light transmission layer 7.

In an embodiment, the first photodiode layer 2 may comprise: a red photodiode layer 21 stacked below the red light filter layer 61 and configured to convert a red light signal into an electrical signal; a green photodiode layer 22 stacked below the green light filter layer 62 and configured to convert a green light signal into an electrical signal; and a blue photodiode layer 23 stacked below the blue light filter layer 63 and configured to convert a blue light signal into an electrical signal. The red photodiode layer 21, the green photodiode layer 22, the blue photodiode layer 23, and the infrared light guiding layer 8 are arranged, in an embodiment, on the same layer.

In an embodiment, the wiring layer 1 configured to process the electrical signals is stacked below the first photodiode layer 2 and the infrared light guiding layer 8. In an embodiment, the second photodiode layer 3 may be an infrared photodiode layer, wherein the infrared photodiode layer is stacked below the wiring layer 1. In an embodiment, the substrate layer 9 may be stacked below the infrared photodiode layer 3.

Referring now to FIG. 5, an imaging plane of a visible light and an infrared light according to an embodiment is illustrated. The solid line represents a visible light, and the dotted lines represent an infrared light. In an embodiment, the second microlens layer has a surface curvature smaller than that of the first microlens layer. More specifically, the surface curvature of a microprism of the infrared light pixels shall be smaller than that of a microprism of the visible light pixels. In FIG. 5, the upper semi-elliptical projection is the microprism of the infrared light pixels.

A greater focal distance indicates a longer focal point and a smaller lens curvature, whereas a smaller focal distance indicates a shorter focal point and a greater lens curvature. As such, by defining the surface curvature of the microprism of the infrared light pixels to be smaller than that of the microprism of the visible light pixels, the infrared light energy may excite charges in the infrared photodiode layer.

In an embodiment, the thickness of the wiring layer may be adjusted according to a focal plane deviation between the infrared light and the visible light. For example, if the actual image plane deviation is 18 micrometers, the thickness of the wiring layer is adaptively adjusted such that the energy emitted by the infrared light is at its strongest, and the focal point is most accurate. Furthermore, by defining the surface curvature of the microprism of the infrared light pixels to be smaller than the surface curvature of the microprism of the visible light pixels, the infrared light energy may excite charges in the infrared photodiode layer. Additionally, the electron excitation depth of the infrared light is deeper. In an embodiment, the infrared photodiode layer may be designed to be deeper, with a depth greater than 4 micrometers.

The composite image sensor according to the embodiments may solve the problem that the images of various light waves formed by the composite image sensor are not in the same plane and the focal distances of various light waves may not be considered simultaneously, thus improving the image quality.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A device, comprising:
   a processor;
   a composite image sensor, including:
      a wiring layer that processes electrical signals, the wiring layer comprising a thickness;
      a first photodiode layer configured to convert a first light wave signal into a first light wave image, wherein the first light wave signal comprises a first focal distance; and
      a second photodiode layer configured to convert a second light wave signal into a second light wave image, wherein the second light wave signal comprises a second focal distance;
      wherein the first photodiode layer and the second photodiode layer are arranged on different layers of the wiring layer;
      wherein the thickness of the wiring layer corresponds to an image plane deviation between the first light wave image and the second light wave image, the image place deviation negating a difference in focus between the first focal distance and the second focal distance; and
   a memory device that stores instructions executable by the processor to:
      form, based at least in part on the image plane deviation, the first light wave image and the second light wave image in a same plane, the same plane corresponding to an equivalence in image quality of the first light wave image and the second light wave image.

2. The device of claim 1, wherein the wiring layer is located between the first photodiode layer and the second photodiode layer.

3. The device of claim 1, the first photodiode layer is stacked in a first direction, wherein the second photodiode layer is stacked in a second direction, and wherein the first direction is opposite the second direction.

4. The device of claim 1, wherein the thickness of the wiring layer is set according to a difference between wavelengths of different light types.

5. The device of claim 1, wherein the different light types are visible light and infrared light.

6. The device of claim 1, wherein the thickness of the wiring layer is set by the thickness of the wiring layer.

7. The device of claim 1, further comprising:
   a first microlens layer that senses the first light wave signal;
   a second microlens layer that senses the second light wave signal, wherein the first microlens layer and the second microlens layer are arranged on the same layer;
   a light filter layer stacked below the first microlens layer; and a second light wave transmission layer stacked below the second microlens layer and configured to transmit the second light wave signal;

wherein no light filters are arranged on the second light wave transmission layer, and the second light wave transmission layer and the light filter layer are arranged on the same layer.

8. The device of claim 7, wherein the second microlens layer is an infrared light microlens layer and the first microlens layer further comprises a red light microlens layer, a green light microlens layer; and a blue light microlens layer, wherein the red light microlens layer, the green light microlens layer, and the blue light microlens layer are arranged on the same layer.

9. The device of claim 8, wherein the light filter layer comprises a red light filter layer, a green light filter layer; and a blue light filter layer, wherein the red light filter layer, the green light filter layer, and the blue light filter layer are arranged on the same layer.

10. The device of claim 9, wherein the second light wave guiding layer is an infrared light guiding layer and the first photodiode layer comprises a red photodiode layer, a green photodiode layer, and a blue photodiode layer, wherein the red photodiode layer, the green photodiode layer, the blue photodiode layer, and the infrared light guiding layer are arranged on the same layer.

11. A composite image sensor, comprising:
a wiring layer that processes electrical signals, the wiring layer comprising a thickness;
a first photodiode layer configured to convert a first light wave signal into a first light wave image, wherein the first light wave signal comprises a first focal distance; and
a second photodiode layer configured to convert a second light wave signal into a second light wave image, wherein the second light wave signal comprises a second focal distance;
wherein the thickness of the wiring layer corresponds to an image plane deviation between the first light wave image and the second light wave image, the image plane deviation negating a difference in focus between the first focal distance and the second focal distance.

12. The composite image sensor of claim 11, wherein the wiring layer is located between the first photodiode layer and the second photodiode layer.

13. The composite image sensor of claim 11, the first photodiode layer is stacked in a first direction, wherein the second photodiode layer is stacked in a second direction, and wherein the first direction is opposite the second direction.

14. The composite image sensor of claim 11, wherein the thickness of the wiring layer is set according to a difference between wavelengths of different light types.

15. The composite image sensor of claim 11, wherein the different light types are visible light and infrared light.

16. The composite image sensor of claim 11, wherein the thickness of the wiring layer is set by the thickness of the wiring layer.

17. The composite image sensor of claim 11, further comprising:
a first microlens layer that senses the first light wave signal;
a second microlens layer that senses the second light wave signal, wherein the first microlens layer and the second microlens layer are arranged on the same layer;
a light filter layer stacked below the first microlens layer; and
a second light wave transmission layer stacked below the second microlens layer and configured to transmit the second light wave signal;
wherein no light filters are arranged on the second light wave transmission layer, and the second light wave transmission layer and the light filter layer are arranged on the same layer.

18. The composite image sensor of claim 17, wherein the second microlens layer is an infrared light microlens layer and the first microlens layer further comprises a red light microlens layer, a green light microlens layer; and a blue light microlens layer, wherein the red light microlens layer, the green light microlens layer, and the blue light microlens layer are arranged on the same layer.

19. The composite image sensor of claim 18, wherein the light filter layer comprises a red light filter layer, a green light filter layer; and a blue light filter layer, wherein the red light filter layer, the green light filter layer, and the blue light filter layer are arranged on the same layer.

20. A method, comprising:
providing a first photodiode layer that converts a first light wave signal into a first light wave image, wherein the first light wave signal comprises a first focal distance;
providing a second photodiode layer that converts a second light wave signal into a second light wave image, wherein the second light wave signal comprises a second focal distance;
providing a wiring layer that processes electric signals from the first photodiode layer and the second photodiode layer, the wiring layer comprising a thickness;
wherein the first photodiode layer and the second photodiode layer are arranged on different layers of the wiring layer;
wherein the thickness of the wiring layer corresponds to an image plane deviation between the first light wave image and the second light wave image, the image plane deviation negating a difference in focus between the first focal distance and the second focal distance; and
forming, based at least in part on the image plane deviation, the first light wave image and the second light wave image in a same plane, the same plane corresponding to an equivalence in image quality of the first light wave image and the second light wave image.

* * * * *